(12) United States Patent
Marafin et al.

(10) Patent No.: US 12,057,830 B2
(45) Date of Patent: Aug. 6, 2024

(54) ELECTRONIC CONTROL DEVICE

(71) Applicant: CAREL INDUSTRIES S.p.A., Brugine (IT)

(72) Inventors: Paolo Marafin, Brugine (IT); Stefano Tobio, Brugine (IT); Francesco Del Zoppo, Brugine (IT)

(73) Assignee: CAREL INDUSTRIES S.p.A., Brugine (IT)

( * ) Notice: Subject to any disclaimer, the term of this patent is extended or adjusted under 35 U.S.C. 154(b) by 288 days.

(21) Appl. No.: 17/639,450

(22) PCT Filed: Sep. 2, 2020

(86) PCT No.: PCT/IB2020/058159
§ 371 (c)(1),
(2) Date: Mar. 1, 2022

(87) PCT Pub. No.: WO2021/044304
PCT Pub. Date: Mar. 11, 2021

(65) Prior Publication Data
US 2022/0345129 A1    Oct. 27, 2022

(30) Foreign Application Priority Data

Sep. 2, 2019    (IT) .................. 102019000015393

(51) Int. Cl.
*H03K 17/96*    (2006.01)
*F21V 3/04*    (2018.01)
(Continued)

(52) U.S. Cl.
CPC ......... *H03K 17/9622* (2013.01); *F21V 3/049* (2013.01); *F21V 23/005* (2013.01);
(Continued)

(58) Field of Classification Search
CPC ...... H03K 2217/960755; H03K 2217/960785; H03K 17/9622; H03K 17/96;
(Continued)

(56) References Cited

U.S. PATENT DOCUMENTS

2017/0031480 A1    2/2017    Gabriel et al.

FOREIGN PATENT DOCUMENTS

| EP | 1970479 A2 | 9/2008 |
|---|---|---|
| EP | 2385630 A2 | 11/2011 |

(Continued)

OTHER PUBLICATIONS

International Search Report & Written Opinion dated Dec. 2, 2020 from corresponding PCT Application No. PCT/IB2020/058159.

*Primary Examiner* — Anthony R Jimenez
(74) *Attorney, Agent, or Firm* — INNOVATION CAPITAL LAW GROUP, LLP; Vic Lin

(57) ABSTRACT

Electronic control device (10) comprising: —an electronic circuit (11) having an operative face (11a) on which a plurality of LEDs (12) are mounted; —a frame (13) defining a plurality of first channels (14) which face the LEDs so as to guide their light radiation; —a composite screen (15) which covers the first channels (14) so as to be crossed by a light radiation coming from the LEDs (12) and guided by the first channels (14) towards the composite screen (15). The composite screen (15) comprises: —a diffuser layer (16) configured to homogenize a light radiation that crosses it; —an operative layer (17) having electronic tracks comprising touch-sensitive pads (18) and connection contacts (19). The electronic control device (10) further comprises at least one connector (20) which connects electrically the connection contacts (19) to the electronic circuit (11) in order to transmit to the latter electrical signals following (Continued)

touching, by a user, of at least one of said sensitive pads (18) on the composite screen (15).

11 Claims, 2 Drawing Sheets

(51) Int. Cl.
*F21V 23/00* (2015.01)
*F21Y 115/10* (2016.01)

(52) U.S. Cl.
CPC .................... *F21Y 2115/10* (2016.08); *H03K 2217/960755* (2013.01); *H03K 2217/960785* (2013.01)

(58) Field of Classification Search
CPC .. F21Y 2115/10; F21Y 115/10; F21V 23/005; F21V 3/049; F21V 3/04; F21V 23/00; H01H 13/70; H01H 13/7006; H01H 13/702; H01H 13/83; H01H 2003/0293; H01H 2239/074; H01H 9/16; H01H 13/023; H01H 15/025; H01H 2013/026; H01H 2219/036; H01H 2219/046
USPC ......................................................... 200/600
See application file for complete search history.

(56) References Cited

FOREIGN PATENT DOCUMENTS

| | | | |
|---|---|---|---|
| EP | 3280053 | A2 | 2/2018 |
| WO | 2010038034 | A1 | 4/2010 |
| WO | 2013072040 | A1 | 5/2013 |

ELECTRONIC CONTROL DEVICE

The present invention relates to an electronic control device, in particular for refrigerating apparatus such as vending machines, bottle coolers and refrigerated counters.

In particular, the electronic control device which forms the subject of the present invention has a structure which can be made and personalized more easily compared to conventional electronic control devices.

Nowadays, in fact, a conventional electronic control device comprises a 7-segment display which is designed to form numerical symbols or stylized letters. A 7-segment display consists of an integrated device which comprises a PCB having, fixed thereon, LEDs covered by a screen provided with seven segments, arranged in a figure of 8, which are translucent so that lighting-up of each LED corresponds to the illumination of a segment.

A tactile interface is fixed above the 7-segment display.

It comprises an interface screen provided with command symbols and a circuit fixed underneath the screen and provided with touch-sensitive components situated opposite the command symbols.

The interface screen is composed of two layers, an outer transparent layer and a finishing layer which is silkscreen-printed onto the inner face of the outer layer so as to form a rim surrounding the alphanumeric screen of the 7-segment display and having the command symbols.

The personalization of this conventional device may relate to the color of the 7-segment display and/or to the graphics of the interface screen.

In fact, a particular color for the backlighting of the color display and/or graphics may be required, with a personalized color or style of the command symbols Therefore, in order to ensure the availability of such personalized features it is necessary to provide 7-segment displays with different colors and it may be necessary to commission, from the supplier, interface screens with personalized printed effects, thereby negatively affecting the production economy in particular in the case of small batches.

The problem underlying the present invention is therefore that of simplifying the production of electronic control devices.

The task of the present invention is therefore that of finding a solution to this problem by providing an electronic control device which requires simpler components and which can be more easily personalized.

In connection with this task, an object of the present invention is to provide an electronic control device where it is possible to dispense with the use of a 7-segment display.

A further object of the invention is to provide an electronic control device which is able to allow simple operation by means of a tactile interface.

This task, as well as these and other objects which will become clearer below are achieved by an electronic control device according to the attached independent claim 1.

Detailed characteristic features of an electronic control device according to the invention are contained in the dependent claims.

Further characteristic features and advantages of the invention will emerge more clearly from the description of a preferred, but non-exclusive embodiment of an electronic control device according to the invention, shown by way of a non-limiting example in the attached sets of drawings in which.

Figure 1:
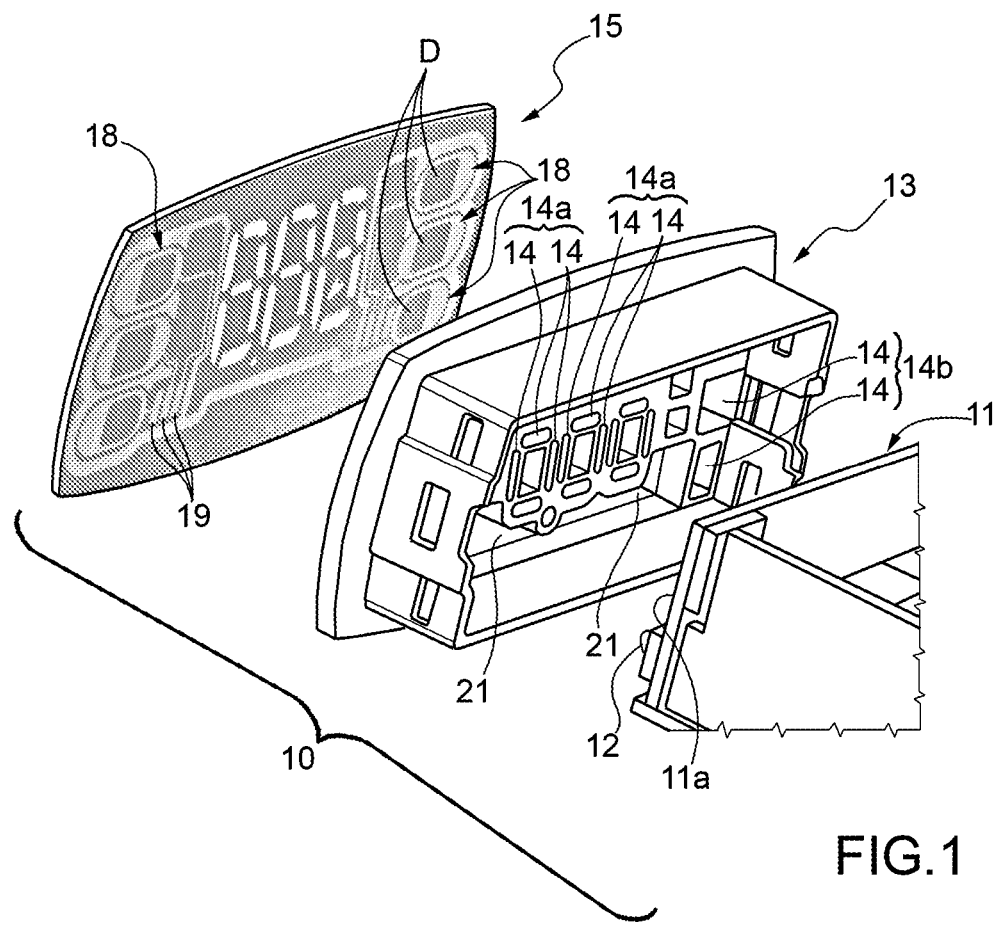
FIG. 1 shows a partially exploded, partial perspective view of an electronic control device according to the present invention.

With particular reference to the said figures, 10 denotes overall an electronic control device 10 which, in accordance with the present invention, may comprise:

an electronic circuit 11 or PCB having an operative face 11a on which a plurality of LEDs 12 are mounted;
a frame 13 defining a plurality of first channels 14 which face said LEDs so as to guide their light radiation;
a composite screen 15 which covers the first channels 14 so as to be crossed by a light radiation coming form the LEDs and guided by said first channels towards said composite screen 15.

said composite screen 15 comprises:

a diffuser layer 16 configured to homogenize a light radiation that crosses it;
an operative layer 17 which may be made of silver or comprise an alloy thereof, having electronic tracks comprising touch-sensitive pads 18 and connection contacts 19;

The diffuser layer 16 may be configured to ensure a homogeneous light intensity of a light radiation from the LEDs 12 output from each of the first channels 14 such that the light image, provided by the cross-sectional form of the first channels 14, visible on the outside of the composite screen 15, has a uniform intensity.

The electronic control device 10 may further comprise at least one connector 20 which electrically connects the connection contacts 19 to the electronic circuit 11 in order to transmit to the latter electrical signals following touching, by a user, of at least one of the sensitive pads 18 on the composite screen 15.

The electronic circuit 11 may be configured to process signals received from the sensitive pads 18.

In particular, the electronic circuit 11 may form part of or constitute a controller for refrigerating apparatus such that it may be configured to process said signals so as to operate said refrigerating apparatus depending on said signals. An electronic control device 10 according to the present invention therefore does not require a preconfigured 7-segment display in order to be made and assembled.

In fact, the function of the 7-segment display may be defined by the cooperation of the frame 13 with the composite screen 15 and the LEDs 12.

As described below in greater detail, in effect, the composite screen 15 and/or the frame 13 may be configured so that, following lighting-up of the LEDs 12, luminous images are formed on the composite screen 15 and may therefore comprise segments designed to form digits and letters and/or symbols or icons.

The color of these luminous images may be easily modified by arranging, between the LEDs and the outside of the composite screen 15, means for modifying the color of the light emitted by the LEDs 12, such as a colored film, as described below in greater detail.

A manufacturer of an electronic control device 10 according to the present invention will therefore not have to procure 7-segment displays designed with specific coloring, thus avoiding the problems associated with the warehouse management and supply of these devices.

The form of the aforementioned images may be defined by a preformed film which is incorporated in the composite screen 15 and has light-permeable, for example perforated, zones designed to define, in negative, matrices for said images.

Or these images may be defined by light-permeable zones which are formed through an opaque film or an opaque layer incorporated in the composite screen 15, in which case these images may for example be obtained by means of selective removal of parts of said opaque film or the opaque layer, for example by means of laser.

Both the use of the aforementioned preformed film and of the opaque film or opaque layer shaped by means of selective removal make it extremely easy to personalize the electronic control device 10 according to the present invention, making it possible to form the aforementioned images according to the specific requirements of the client without a substantial increase in the production costs. Owing to the incorporation of the operative layer 17 in the composite screen 15, the electronic control device 10 may be easily operated, allowing the signals resulting from the operative layer 17 to be transferred to the electronic circuit 11 by means of suitable electric transmission means illustrated more clearly below. In greater detail, the first channels 14 may form at least one first group 14a of first channels 14, where the first channels 14 of the first group 14a are at least seven in number and are configured and arranged so as to form a digit or letter for a 7-segment display.

Figure 3:
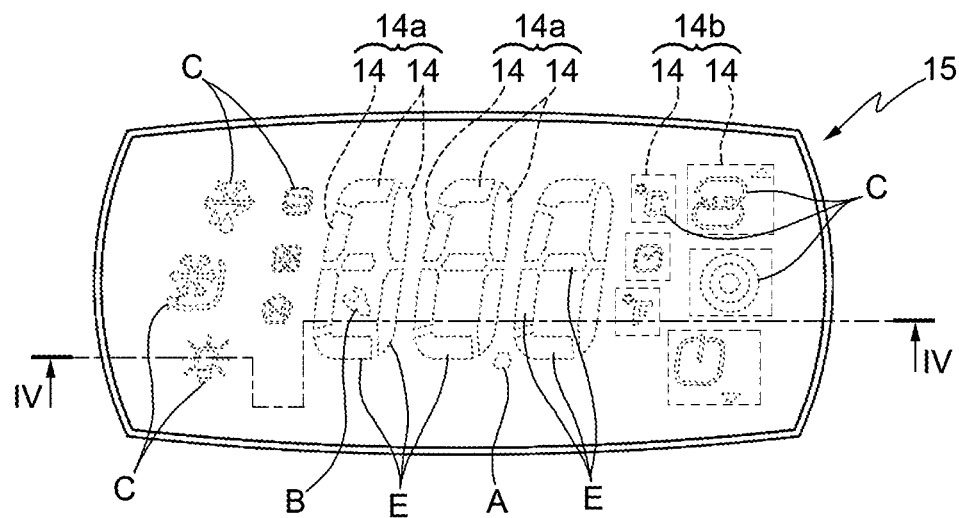
FIG. 3 shows a simplified view of the detail of FIG. 2, in a plan view.

For example, the electronic control device 10 may comprise three of the first groups 14a, as shown for example in FIG. 3, so as to be able to display three letters and/or digits on the composite screen 15 during operation of the electronic control device 10.

The first channels 14 may also comprise channels designed to form a full stop A and/or a comma or, more generally, a separator, such as a hyphen between two consecutive digits and/or letters, or a symbol B.

The first channels 14 may also form a second group 14b of first channels 14, where the first channels 10 of the second group 14b face the sensitive pads 18 in order to illuminate the composite screen 15 opposite the latter, so that the user is able to view symbols C identifying the commands which can be operated by means of the sensitive pads 18.

Thus, in general, according to a possible aspect of the present invention, the electronic control device 1 may be configured to form a plurality of luminous signs on the composite screen 15 by means of backlighting of the composite screen 15 following selective switching-on of the LEDs 12 of the electronic circuit 11 which face the first channels 14 of the second group 14b.

An example of these luminous signs are the aforementioned symbols C.

In order to form these luminous signs, the electronic control device 10 may have the composite screen 15 which comprises an opaque matrix layer provided with transparent or perforated light-permeable portions which are configured to form the luminous signs.

With particular reference to FIG. 3, for example, the transparent or perforated light-permeable portions of the matrix layer may be shaped so as to form the symbols C which are shown in this figure by means of a broken line on both sides of the seven-segment numbers.

Figure 2:
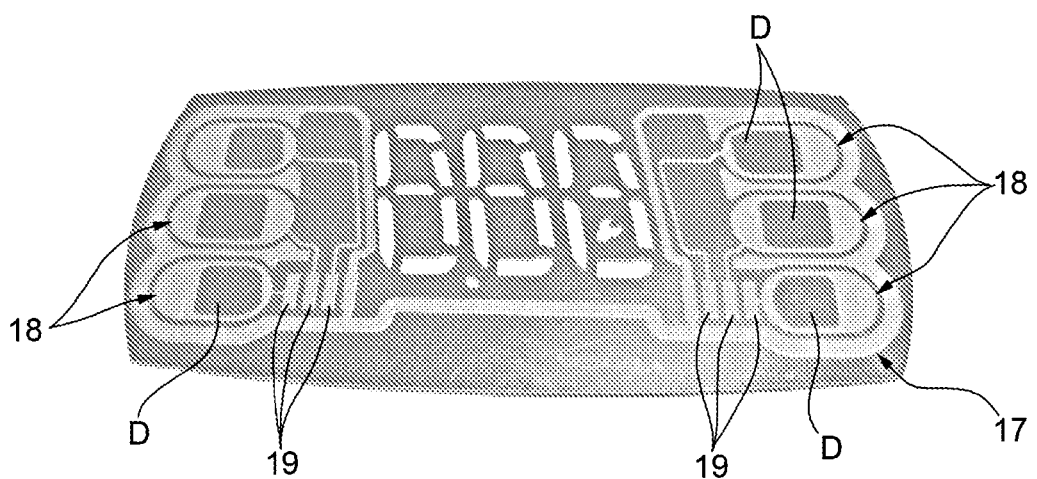
FIG. 2 shows a perspective view, from the rear, of a component of the composite screen of an electronic control device according to the present invention.

Alternatively, the frame 13 may comprise walls for closing the first channels 14 of the second group 14b, where the closing walls will be opaque and have transparent or perforated light-permeable parts configured to form said luminous signs The sensitive pads 18 may be shaped as a closed ring, as for example shown in FIG. 2, or open ring, so as to each delimit a zone D of the composite screen 15, surrounding it at least partially.

Each first channel 14 of the second group 14b may face a zone D of the composite screen 15 so as to convey there light generated by an LED 12.

The frame 13 may also have at least one second channel 21 facing the connection contacts 19.

Generally, the at least one connector 20 may extend across the at least one second channel 21, between the electronic circuit 11 and the composite screen 15.

For example, in the embodiment of the attached figures there are two connectors 20 which extend across a corresponding number of second channels 21 so as to connect the electronic circuit 11 to the composite screen 15 and specifically to the sensitive pads 18 of the operative layer 17.

In one possible embodiment of the present invention, not shown in the attached figures, the at least one connector 20 may comprise (or consist of) an electrically conductive element having a matrix of elastomer material which extends between the electronic circuit 11 and the connection contacts 19 with which it is in electrical contact.

The matrix of elastomer material may be fixed inside the at least one second channel 21, so as to avoid an excessive pressure being exerted on the composite screen, which could weaken the strength of the connection thereof to the frame 13.

Figure 4:
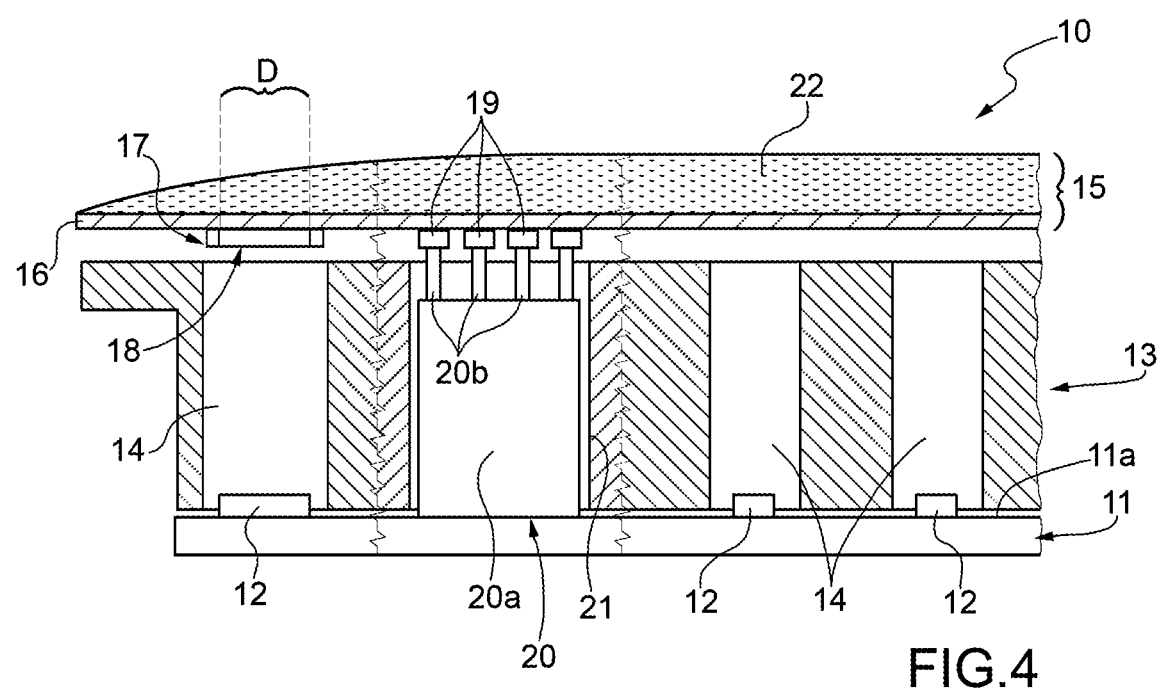
FIG. 4 shows a partial cross-section of an electronic control device according to the present invention, along the plane IV-IV of FIG. 3.

In a possible alternative, shown by way of example in FIG. 4, the at least one connector 20 comprises a protuberance 20a from which elastically yielding metal contacts 20b project.

The protuberance 20a will extend between the electronic circuit 11 and the connection contacts 19 with which the metal contacts 20a make electrical contact by means of the elastic action, or reaction, of the latter.

The composite screen 15 may be fixed to the frame 13, for example by means of ultrasound welding, via at least one sealing lip integral with the composite screen 15 or the frame 13 and fastened by means of melting to the frame 13 or the composite screen 15, respectively.

Alternatively, the composite screen 15 may be fixed to the frame 13, by means of adhesion, for example by means of a double-sided adhesive film arranged between the composite screen 15 and the said frame 13, for example along at least one perimetral edge section of the composite screen 15.

The composite screen 15 may also comprise a chromatic layer and/or a protective layer 22, where the chromatic layer is configured to confer a predefined color to the light emitted by the LEDs.

The protective layer 22 may be transparent or translucent or may define an outer face of the composite screen 15 so as to be exposed on the outside of the electronic control device 10 for touching by a user in order to operate the sensitive pads 18.

The diffuser layer 16 may be silkscreen-printed or applied onto the protective layer 22, and in turn the matrix layer, if present, the chromatic layer, if present, and the operative layer 17 may be silkscreen-printed or applied, in series, thereon.

In this way, the production of an electronic control device 10 is greatly simplified compared to the conventional solutions, allowing moreover a high degree of personalization of both the color of the composite screen and the color of the luminous signs and the digits and/or numbers which may be displayed thereon.

The invention thus conceived may be subject to numerous modifications and variations, all of which fall within the scope of protection of the accompanying claims.

Moreover all the details may be replaced by other technically equivalent elements.

In practice, the materials used as well as the associated forms and dimensions may be varied depending on the particular requirements and the state of the art. Where the constructional characteristics and the techniques mentioned in the following claims are followed by reference symbols or numbers, these reference symbols or numbers have been assigned with the sole purpose of facilitating understanding of the said claims and consequently they do not limit in any way the interpretation of each element which is identified, purely by way of example, by said reference symbols or numbers.

The invention claimed is:

1. An electronic control device (10) comprising:
an electronic circuit (11) having an operative face (11a) on which a plurality of LEDs (12) are mounted;
a frame (13) defining a plurality of first channels (14) which face said LEDs (12) so as to guide their light radiation;
a composite screen (15) which covers said first channels (14) so as to be crossed by a light radiation coming from said LEDs (12) and guided by said first channels (14) towards said composite screen (15);
said composite screen (15) comprises:
a diffuser layer (16) configured to homogenize a light radiation that crosses it;
an operative layer (17) having electronic tracks comprising touch-sensitive pads (18) and connection contacts (19);
said electronic control device (10) further comprising at least one connector (20) which electrically connects said connection contacts (19) to said electronic circuit (11) in order to transmit to the latter electrical signals following touching, by a user, of at least at one of said sensitive pads (18) on said composite screen (15),
wherein said frame (13) has at least one second channel (21) facing said connection contacts (19);
wherein said at least one connector (20) extends through said at least one second channel (21) between said electronic circuit (11) and said composite screen (15); and
wherein said at least one connector (20) comprises an electrically conductive element having a matrix made of elastomeric material and extending between said electronic circuit (11) and said connection contacts (19) with which it is in electrical contact, said matrix of elastomeric material is fixed inside said at least one second channel (21).

2. The electronic control device (10) according to claim 1, wherein said composite screen (15) is fixed to said frame (13) optionally:
by ultrasonic welding of at least one sealing lip integral with said composite screen (15) or said frame (13) and fastened by means of melting to said frame (13) or to said composite screen (15), respectively; and/or
by adhesion, preferably by means of a double-sided adhesive film arranged between said composite screen (15) and said frame (13).

3. The electronic control device (10) according to claim 1, wherein said first channels (14) form at least a first group (14a) of first channels (14) where the first channels (14) of said first group (14a) are seven in number and are configured and arranged to form a digit or letter for a 7-segment display.

4. The electronic control device (10) according claim 3, wherein said first channels (14) form a second group (14b) of first channels (14) where the first channels (14) of said second group (14b) face said sensitive pads (18), so as to illuminate said composite screen (15) in the area of said sensitive pads (18).

5. The electronic control device (10) according to claim 4, configured to form a plurality of luminous signs on said composite screen (15), by backlighting said composite screen (15) following the selective turning-on of LEDs (12) of said electronic circuit (11), facing the first channels (14) of said second group (14b); wherein optionally:
said composite screen (15) comprises an opaque matrix layer provided with light-permeable, transparent or perforated portions, which are configured to form said signs;
said frame (13) comprises walls for closing the first channels (14) of said second group (14b), where said closing walls are opaque and have parts that are light-permeable, transparent or perforated and are configured to form said signs.

6. The electronic control device (10) according to claim 5, wherein said sensitive pads (18) are shaped as a closed or open ring so as to each delimit one zone (D) of said composite screen (15), at least partially surrounding it; each first channel (14) of said second group (14b) facing a zone (D) of said composite screen (15).

7. The electronic control device (10) according to claim 1, wherein said first channels (14) form a second group (14b) of first channels (14) where the first channels (14) of said second group (14b) face said sensitive pads (18), so as to illuminate said composite screen (15) in the area of said sensitive pads (18).

8. The electronic control device (10) according to claim 7, wherein said sensitive pads (18) are shaped as a closed or open ring so as to each delimit one zone (D) of said composite screen (15), at least partially surrounding it; each first channel (14) of said second group (14b) facing a zone (D) of said composite screen (15).

9. The electronic control device (10) according to claim 7, configured to form a plurality of luminous signs on said composite screen (15), by backlighting said composite screen (15) following the selective turning-on of LEDs (12) of said electronic circuit (11), facing the first channels (14) of said second group (14b); wherein optionally:
said composite screen (15) comprises an opaque matrix layer provided with light-permeable, transparent or perforated portions, which are configured to form said signs;
said frame (13) comprises walls for closing the first channels (14) of said second group (14b), where said closing walls are opaque and have parts that are light-permeable, transparent or perforated and are configured to form said signs.

10. The electronic control device (10) according to claim 9, wherein said composite screen (15) comprises a chromatic layer and/or a protective layer (22), where said chromatic layer is configured to confer a color to the light emitted by said LEDs; said protective layer (22) being transparent and defining an outer face of said composite screen so as to be touched by a user in order to operate said sensitive pads 18.

11. The electronic control device (10) according to claim 9, wherein said sensitive pads (18) are shaped as a closed or open ring so as to each delimit one zone (D) of said composite screen (15), at least partially surrounding it; each first channel (14) of said second group (14*b*) facing a zone (D) of said composite screen (15).

\* \* \* \* \*